United States Patent [19]

Koleske et al.

[11] Patent Number: 4,645,781
[45] Date of Patent: Feb. 24, 1987

[54] BLENDS OF CYCLIC VINYL ETHER CONTAINING COMPOUNDS AND EXPOXIDES

[75] Inventors: Joseph V. Koleske, Charleston, W. Va.; George T. Kwiatkowski, Green Brook, N.J.

[73] Assignee: Union Carbide Corporation, Danbury, Conn.

[21] Appl. No.: 480,473

[22] Filed: Mar. 29, 1983

[51] Int. Cl.$^4$ .......................... C08F 2/50; C08F 34/02; C08F 234/02

[52] U.S. Cl. ...................................... 522/169; 522/31; 522/170; 522/77; 528/361

[58] Field of Search ...................... 204/159.11, 159.23; 522/169, 170, 31

[56] References Cited

U.S. PATENT DOCUMENTS

| | | | |
|---|---|---|---|
| 3,116,301 | 12/1963 | Williams | 200/345.8 |
| 3,794,576 | 2/1974 | Watt | 204/159.11 |
| 3,794,579 | 2/1974 | Enomoto et al. | 208/40 |
| 3,893,985 | 7/1975 | Papa et al. | 526/266 |
| 3,897,255 | 7/1975 | Erickson | 204/159.23 |
| 4,007,209 | 2/1977 | Hickman et al. | 204/159.23 |
| 4,184,004 | 1/1980 | Pines | 428/413 |
| 4,299,938 | 11/1981 | Green et al. | 204/159.11 |
| 4,383,025 | 5/1983 | Green et al. | 204/159.11 |

FOREIGN PATENT DOCUMENTS

| | | |
|---|---|---|
| 123912 | 11/1984 | European Pat. Off. . |
| 1355840 | 2/1964 | France . |
| 44945 | 7/1966 | German Democratic Rep. . |
| 453708 | 6/1968 | Switzerland . |
| 1091463 | 11/1967 | United Kingdom . |
| 2073760 | 10/1981 | United Kingdom . |

OTHER PUBLICATIONS

Minakova et al. Chemical Abstracts CA89(26):216123c 1978.
Stankevich et al. Chemical Abstracts CA87(3):22958s 1977.
"New Monomers . . . ", Radiation Curing VI Sep. 20–23, 1982, pp. 4–28.

Primary Examiner—Wilbert J. Briggs, Sr.
Assistant Examiner—A. H. Koeckert
Attorney, Agent, or Firm—Jean B. Mauro

[57] ABSTRACT

Described herein are compositions suitable for photocopolymerization comprising a cyclic vinyl ether containing compound and an epoxide. These compositions can be cured to give coatings with improved flexibility and impact resistant properties.

11 Claims, No Drawings

BLENDS OF CYCLIC VINYL ETHER CONTAINING COMPOUNDS AND EPXOXIDES

BACKGROUND OF THE INVENTION

It is well known that coatings play a useful role in the manufacture of a wide variety of useful articles. Until recently, nearly all coatings were formulated and applied by employment of an organic solvent, which often comprised a major portion of the total formulated coating. After the coating is applied to the article to be coated, the organic solvent is evaporated leaving the dried coating on the article to serve its decorative or functional purpose. This coating system has met with increasing disfavor as the cost of energy needed to evaporate the solvent at the rate required by industry increased, as the price of the solvent increased, and as the deleterious environmental effects of the evaporated solvent became better understood. In addition, governmental regulations have placed ever increasing restrictions on the amounts and types of solvents or organic volatiles permitted to escape into the atmosphere from coatings compositions. Systems aimed at solvent recovery to reduce pollution and conserve solvent have generally proven to be energy intensive and expensive.

Considerable efforts have been expended by those skilled in the art to develop coating compositions having a minimal amount of volatile organic components and this has led to development of powder coatings, radiation-curable coatings, water borne coatings and high solids coatings. In these recent developments, the amounts of organic solvents present are minimal and consequently there is little or no atmospheric pollution.

Among the new coating systems, radiation-curable coatings, usually cured with ultraviolet light or electron beam radiation, offer a variety of advantages. They require only minimal energy to effect cure—change from liquid to solid state—they do not contain solvents, and thus do not cause deleterious effects to the environment, and they are cost effective, since effectively all of the applied liquid is converted to a solid coating.

An important disadvantage of photocurable systems is the frequency requirement that the curing process be conducted in an inert atmosphere because of the inhibiting effect of oxygen.

Responding to such problems, those skilled in the art have devised photocurable coatings which cure through a mechanism termed cationic polymerization. In these systems, the starting materials are mixed with catalysts which form acids when exposed to ultraviolet light; the starting materials are therefore polymerized via cationic catalysis.

Epoxy resins, linear vinyl ethers, and cyclic vinyl ethers have been shown to be suitable starting materials for photocure via cationic polymerization, as disclosed in, for example, U.S. Pat. No. 3,794,576; the publication "New Monomers for Cationic UV-Curing", Conference Proceedings, Radiation Curing VI, pages 4–28, Sept. 20–23, 1982; and British publication GB 2,073,760A.

However, a photocurable coating composition that can be cured by cationic polymerization and having increased toughness over compositions as are currently known would be highly desirable.

THE INVENTION

It has now been found that photocurable coatings can be prepared from blends of cyclic vinyl ether containing compounds and epoxy containing compounds. The photocurable coatings can be used by cationic polymerization. These novel photocurable compositions cure to give coatings with improved flexibility and impact resistant properties.

The cyclic vinyl ethers suitable for use in this invention include dihydropyranyl and/or di-(dihydropyranyl) compounds.

The di-(dihydropyranyl) compounds employed in the present invention comprise two 3,4-dihydro-2H-pyranyl rings which are interconnected by a linking chain bonded at either end to the 2-position of the respective pyranyl rings. In simplified form, the preferred compounds for use in the present invention have the following general Formula A:

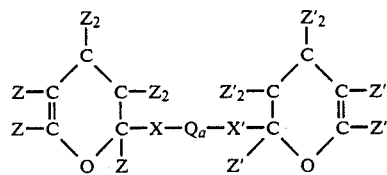

wherein:

Z and Z' (when Z and Z' are defined herein the definition includes $Z_2$ and $Z'_2$) each represents hydrogen or an alkyl group having from 1 to 10, and usually no more than 6, carbon atoms;

X and X' are members of the class consisting of a bivalent saturated hydrocarbon group, R, having the structure, $—C_nH_{2n}—$, wherein n is an integer having a value of from 1 to 10; an oxy radical, —O—; and a carbonyl group, —C(O)—; and, in addition X' may be a carbonyloxy group, —O(O)C—, the cabon atom of which is bonded to the 2-position of the dihydropyranyl ring; X and X' may be the same or different provided that taken together they contain either zero or 2 oxygen atoms;

a has a value of from zero to 1, a being zero only when X' is the aforesaid carbonyloxy group;

Q is a member of the class consisting of the aforesaid R group; a dioxyakylene group, —ORO—, wherein R is as defined above; a dicarboxylate group, —OC—(O)—R'—C(O)O,—wherein R' is the nucleus of a dicarboxylic acid; and a polycarbamate group such as the dicarbamate group, —OC(O)NH—R'—NH—C(O)O—, wherein R", as illustrated, is the nucleus of a diisocyanate; and X, X' and Q taken together is such that the linking chain, —X—Q—X'—, contains an even number of oxygen atoms from two to four, provided that when X and X' are both oxy radicals, the linking chain contains no other oxygen atoms (that is, Q or R), and when X and X' are both carbonyl groups, the linking chain contains four oxygen atoms (that is, Q is —ORO—).

Among the suitable di-(dihydropyranyl) compounds which are useful in accordance with the teachings of this invention are the following classes of compounds designated by Formulas A-1 through A-6 below.

1. 3,4-dihydro-2H-pyran-2-methyl(3,4-dihydro-2H-pyran-2-carboxylates) having the formula:

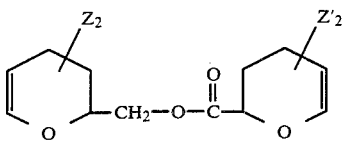

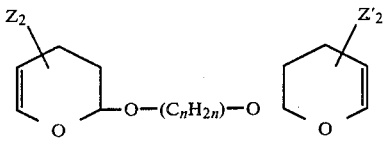

wherein Z, Z' and n have the significance discussed above. Illustrative compounds of this group of di-(dihydropyranyl) compounds are: 1,2-bis-(3',4'-dihydro-2'H-pyran-2'-oxy)ethane; 1,2-bis(3',4'-dihydro-5'-methyl-2'H-pyran-2'-oxy)ethane; 1,3-bis(3',4'-dihydro-5'-methyl-2'H-pyran-2'-oxy)propane; and 1,4-bis(3',4'-dihydro-2'H-pyran-2'oxy)butane. Such compounds are prepared by Diels-Adler addition reactions of divinyl bis-ethers such as the divinyl ethers of alkylene glycols, with alpha, beta-unsaturated aldehydes such as acrolein, methacrolein, and crotonaldehyde under conditions described, for example, by Curtis W. Smoth et al., Journal of the American Chemical Society, Vol. 73, 5267 (1951). For example, the reaction between a mole of ethylene glycol divinyl ether and 2 moles of acrolein provides 1,2-bis(3",4'-dihydro-2'H-pyran-2'-oxy)ethane.

wherein Z and Z' are as above-defined. Preferably a total of from 5 to 7 of the respective Z and Z' groups are hydrogen and correspondingly, from 3 to zero are alkyl groups. When Z and Z' are alkyl groups, they are usually bonded to the 2- and/or 5-position of the respective rings. Typical examples of this class of reactants are: 3,4-dihydro-2-H-pyran-2-methyl(3,4-dihydro-2H-pyran-2-carboxylate) and corresponding alkyl-substituted compounds such as 3,4-dihydro-2,5-dimethyl-2H-pyran-2-methyl(3,4-dihydro-2,5-dimethyl-2H-pyran-2-carboxylate); 3,4-dihydro-2,5-diisobutyl-2H-pyran-2-methyl(3,4-dihydro-2,5-diisobutyl-2H-pyran-2-carboxylate); 3,4-dihydro-2,5-dihexyl-2H-pyran-2-methyl(3,4-dihydro-2,5-dihexyl-2H-pyran-2-carboxylate); and 3,4-dihydro-2,5-didecyl-2H-pyran-2-methyl(3,4-dihydro-2,5-didecyl-2H-pyran-2-carboxylate). The 3,4-dihydro-2H-pyran-2-methyl-(3,4-dihydro-2H-pyran-2-carboxylate) which is commonly referred to as acrolein tetramer is preferred and has the structure:

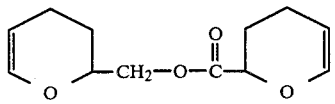

2. Alkanedioxy-bis(3',4'-dihydro-2'H-pyran-2'-carbonyl) compounds having the structure:

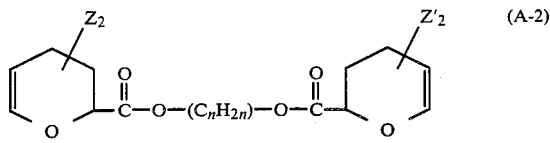

wherein Z and Z' are as above-discussed, and n is an integer from 1 to 10, preferably from 1 to 4. Typical examples of such compounds which are suitable in the practice of this invention are: 1,2-ethanedioxybis-(3',4'-dihydro-2'H-pyran-2'-carbonyl); 1,2-ethanedioxybis-(3',4'-dihydro-5'-methyl-2'H-pyran-2'-carbonyl), and corresponding 1,2-isopropanedioxy and 1,4-butanedioxy compounds. Such compounds can be prepared by the reaction of an alkylene dihalide, X"—(C$_n$H$_{2n}$)—X", wherein n is as aforesaid, and X" is halogen, particularly iodine, chlorine or bromine, with the silver salt of a 3,4-dihydro-2H-pyran-2-carboxylic acid. The latter salts are in turn prepared by the oxidation of 3,4-dihydro-2H-pyran-2-carboxaldehyde in the presence of a silver salt such as silver oxide, preferably in an anhydrous medium containing an organic solvent such as benzene, as described in U.S. Pat. No. 2,514,172.

3. Bis-(3',4'-dihyro-2'H-pyran-2'-oxy)alkanes having the formula:

4. Bis-(3',4'-dihydro-2'H-pyran-2'-alkoxy)alkanes having the formula:

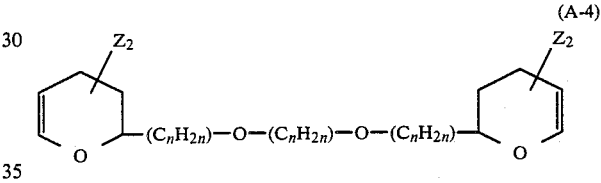

wherein Z, Z' and n are as defined hereinabove. Typical examples of this type of reactant are: 1,1-bis(3',4'-dihydro-2'H-pyran-2'-methoxy)ethane; 1,1-bis(3',4'-dihydro-5'-methyl-2'H-pyran-2'-methoxy)ethane; and 1,2-bis(3',4'-dihydro-2'H-pyran-2'-methoxy)ethane. Such compounds are prepared by the addition of alpha, beta-unsaturated aldehydes (such as, for example, acrolein and metacrolein) to the corresponding bis-unsaturated ethers.

5. Bis-(3',4'-dihydro-2'H-pyran-2'-alkyl) carboxylates having the general formula:

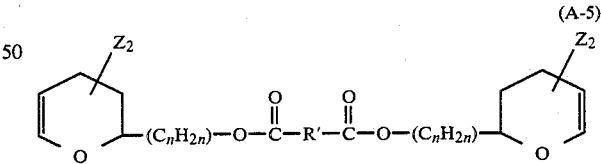

wherein Z, Z' and n are as above-defined; and R' is the nucleus of a dicarboxylic acid and may be a bivalent aliphatic, cycloaliphatic or aromatic nucleus including corresponding halogen-substituted nuclei. Thus, R' may be: a bivalent alkylene group, —(C$_{n°}$H$_{2n°}$)—, wherein n° is an integer of from 1 to 10 as in the saturated acyclic dibasic acid series, HOOC—(CH$_2$)$_{n°}$—COOH, an alkenylene group having from 2 to 10 carbon atoms as in maleic acid and itaconic acid; dimer or trimer acids, or mixtures thereof; an arylene group as in phthalic, isophthalic and terephthalic acids; an aralkylene nucleus as in homophthalic acid; cycloaliphatic nuclei as in the hydrophthalic acids including di-, tetra-, and hexahydrophthalic acids, and bicyclo[2.2.1]hept-5-ene-2,3-dicarboxylic acid; and corresponding halogenated nucli as in chloromaleic acid, tetrachloro- and tetrabromophthalic acids and chlorobicyclo[2.2.1]-hept-5-ene-2,3-dicarboxylic acids such as chlorendic acid. Specific examples of this class of compounds are: bis-(3,4-dihydro-2H-pyran-2-methyl)-succinate, -adipate, -azelate, -sebacate, -tetrachlorophtha-late, -tetrabromophthalate and -chlorendate. This type of reactant is prepared by the condensation of 3,4-dihydro-2H-pyranyl-2-alkanols with the dibasic acid or acid halide of the dibasic acid.

6. Poly-(3',4'-dihydro-2'H-pyran-2'-alkyl) carbamates which comprise the reaction products formed by condensation of 3,4-dihydro-2H-pyranyl-2-carbinols and an organic polyisocyanate such as those described below. Among the suitable polyisocyanates which may be used in the preparation of such monomers for use in the present invention are those having the formula, $R''(NCO)_i$, wherein i is an integer of two or more and R" is an organic radical having the valence of i. R" can be an aliphatic, cycloaliphatic or aromatic radical which may be unsubstituted hydrocarbyl groups or hydrocarbyl groups substituted, for example, with halogen or alkoxy groups. Thus, when i is two, for example, R" is a bivalent substituted or unsubstituted hydrocarbon group such as alkylene, cycloalkylene, arylene, alkyl-substituted cycloalkylene, alkarylene, aralkylene and like groups. Typical examples of such polyisocyanates are: 1,6-hexamethylene diisocyanate; 1,4-tetramethylene diisocyanate; 1-methyl-2,4-diisocyanatocyclohexane; bis(4-isocyanatophenyl)methane; phenylene diisocyanates such as 4-methoxy-1,3-phenylenediisocyanate, 5,6-dimethyl-1,3-phenylenediisocyanate, 2,4-and 2,6-tolylene diisocyanates, tolylene diisocyanate, 6-isopropyl-1,3-phenylenediisocyanate, durylene diisocyanate, triphenylmethane-4,4',4"-triisocyanate, 3-isocyanatomethyl-3,5,5-trimethylcyclohexyl-isocyanate, or 4,4'-dicyclohexyl-methylene diisocyanate and many other orangic polyisocyanates that are known in the art such as those disclosed in an article by Siefkin, Ann. 565,75 (1949). Also included as useful in the preparation of the carbamate monomers employed in this invention are the polyisocyanates of the aniline-formaldehyde polyaromatic type which are produced by phosgenation of the polyamine obtained by acid-catalyzed condensation of aniline with formaldehyde. Polyphenylmethylene polyisocyanates of this type are available commercially under such trade names as PAPI, AFPI, Mondur MR, Isonate 390P, NCO-120 and NCO-20. The products are low viscosity (50–500 centipoises at 25° C.) liquids having average isocyanato functionalities in the range of about 2.25 to about 3.2 or higher, depending upon the specific aniline-to-formaldehyde molar ratio used in the polyamine preparation. Other useful polyisocyanates are combinations of diisocyanates with polymeric isocyanates containing more than two isocyanate groups per molecule. Illustrative of such combinations are: a mixture of 2,4-tolylene diisocyanate, 2,6-tolylene diisocyanate and the aforesaid polyphenylmethylene polyisocyanates; and a mixture of isomeric tolylene diisocyanates with polymeric tolylene diisocyanates obtained as residues from the manufacture of the diisocyanates.

When the isocyanate which is reacted with the 3,4-dihydro-2H-pyran-2-carbinol contains two isocyanato functions, bis-(3',4'-dihydro-2'H-pyran-2-alkyl)dicarbamates are formed having the general formula:

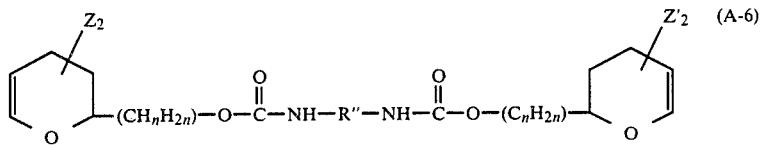

(A-6)

wherein Z, Z' and n are as defined hereinabove; and R" corresponds to the R" nucleus of the isocyanate reactant, $R''(NCO)_i$ when i is two. It is to be understood that when the isocyanate has an isocyanato function greater than two, the pyranyl monomer will have a corresponding average number of carbamate groups and the general formula:

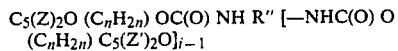

wherein $C_5(Z)_2O$ and $C_5(Z')_2O$ are the respective 3,4-dihydro-2H-pyranyl rings. Typical examples of this class of di-(dihydropyranyl) compounds are toluene-2,4-(or 2,6)-(bis-3',4'-dihydro-2'H-pyran-2'-methyl) carbamate, and the reaction products of 3,4-dihydro-2'H-pyranyl-2-carbinol with the aforesaid polymeric liquids having an average isocyanato function of about 2.25 to about 3.2.

It is, of course, understood by those skilled in the art that when such nitrogen containing compounds are used with photoinitiators, only minor amounts of basic organic nitrogen containing compounds may be used so as not to interfere with the polymerization reaction.

Additional cyclic vinyl ether compounds include the following:

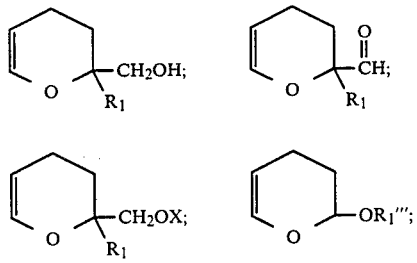

wherein $R_1$ is hydrogen or methyl, $R_1'''$ is alkyl of 1 to 10 carbon atoms, and X is selected from

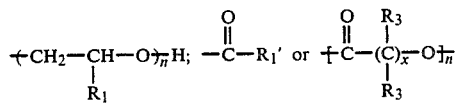

wherein n has a value of from 1 to 50 and wherein $R_1'$ is the residue of a carboxylic acid and can be (1) hydrogen, (2) alkyl which is substituted with any substituent which does not unduly interfere with the polymerization, or unsubstituted, linear or branched, containing up to 20 carbon atoms, such as methyl, ethyl, isopropyl, decyl, eicosyl and the like, and (3) aryl which is substituted with any substituent which does not unduly interfere with the polymerization or, which is unsubstituted, having 6 to 10 ring carbon atoms, such as phenyl, naphthyl, benzyl, penethyl, and the like.

Another group of compounds which are useful in the compositions of this invention are the alkylene oxide adducts of 3,4-dihydropyran-2-methanol of the general formula:

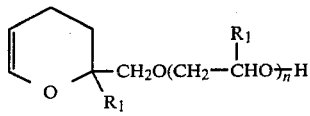

wherein $R_1$ and n are as hereinbefore defined. This class of compounds is prepared by the ethoxylation or propoxylation of 3,4-dihydropyran-2-methanol with a base catalyst such as potassium or sodium metals. The catalyst concentration can be from 0.1 weight percent to 0.4 weight percent, preferably from 0.2 weight percent to 0.3 weight percent based on the weight of the final product. The reaction can be carried out at a temperature of from about 75° C. to about 150° C., preferably from about 100° C. to about 120° C.

Another group of compounds which can be used in the compositions of this invention are the lactone adducts of 3,4-dihydropyran-2-methanol of the general formula:

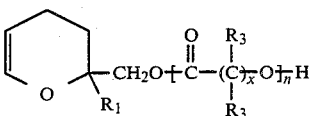

wherein $R_3$ is a hydrogen, alkyl, alkoxy, aryl, cycloalkyl, alkaryl, or aralkyl group having up to 12 carbon atoms and at least (2X-3) of the $R_3$ groups are hydrogen atoms, x has a value of 2 to 12, and $R_1$ and n are as hereinbefore described. This class of compounds is prepared by reacting a lactone with 3,4-dihydropyran-2-methanol at a temperature of 100° C. to 200° C. A catalyst such as stannous octanoate on dibutyl tin dilurate and the like can be used to facilitate the polymerization. The lactones that can be used are epsilon-caprolactone, epsilon-methyl-epsilon-caprolactone, gamma-methyl-epsilon caprolactone, beta-propiolactone, delta-valerolactone, zeta-enantholactone, gamma-ethyl-epsilon-methyl-epsilon-caprolactone, and the like.

These lactone adducts of 3,4-dihydropyran-2-methanol may be reacted with alkylene oxides such as ethylene oxide or propylene oxide to form alkyleneoxide adducts of the lactone adducts of the general formula:

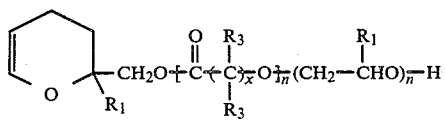

wherein $R_1$, $R_3$, n, and x are as hereinbefore described.
Included in this class of compounds would be the lactone adducts of the alkylene oxide adducts of 3,4-dihydropyran-2-methanol of the general formula:

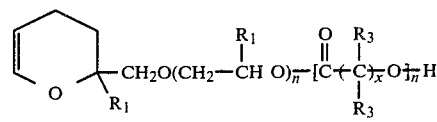

wherein $R_1$, $R_3$, n, and x are as hereinbefore described.

Still another group of compounds which can be used in the compositions of this invention are the esters of at least one organic carboxylic acid and 3,4-dihydropyran-2-methanol corresponding to the formula:

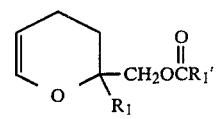

wherein $R_1$ and $R_1'$ are as hereinbefore defined. These compounds are prepared by conventional esterification or transesterification procedures with a suitable catalyst and can contain substituents in the molecule provided they do not unduly interfere with the reaction. These procedures and catalysts are well known to those skilled in the art and require no further elaboration. In the transesterification, the lower alkyl esters of organic acids are preferred sources of the acid moiety.

Another group of compounds which can be used are reaction products of the following:

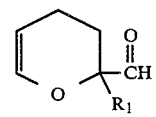

wherein $R_1$ is as previously defined with compounds such as pentaerythritol, formaldehyde, other aldehydes such as isobutyraldehyde to yield cyclic vinyl ether products such as:

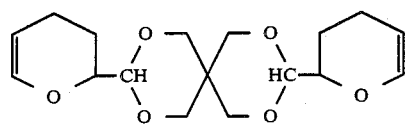

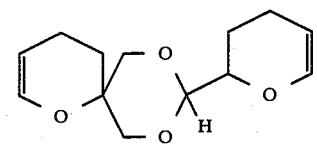

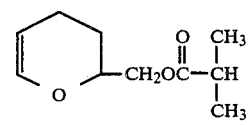

The epoxides which may be used herein may contain at least one epoxy group having the following formula:

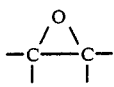

The epoxy groups can be terminal epoxy groups or internal epoxy groups. The epoxides are primarily cycloaliphatic epoxides. These cycloaliphatic epoxide resins may be blended with minor amounts of glycidyl type epoxides, aliphatic epoxides, epoxy cresol novolac resins, epoxy phenol novolac resins, polynuclear phenol-glycidyl ether-derived resins, aromatic and heterocyclic glycidyl amine resins, hydantoin epoxy resins, and the like, and mixtures thereof. The cycloaliphatic epoxide resins may also be blended with minor amounts of cycloaliphatic epoxides having a viscosity of less than 200 centipoise such as:

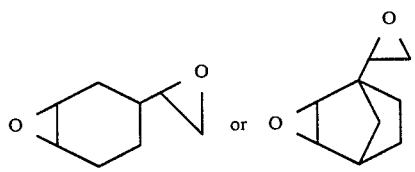

Further, such cycloaliphatic epoxides may be blended with other epoxides described above. These epoxides are well known in the art and many are commercially available.

Suitable cycloaliphatic epoxide resins for purposes of this invention are those having an average of two or more vicinal epoxy groups per molecule. Illustrative of suitable cycloaliphatic epoxides are the following:

FORMULA 1

Diepoxides of cycloaliphatic esters of dicarboxylic acids having the formula:

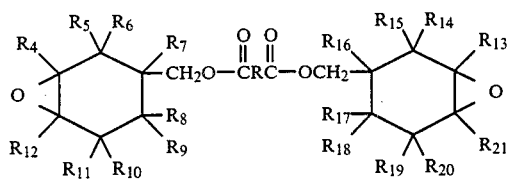

wherein $R_4$ through $R_{21}$, which can be the same or different, are hydrogen or alkyl radicals generally containing one to nine carbon atoms inclusive, and preferably containing one to three carbon atoms, inclusive, as for example methyl, ethyl, n-propyl, n-butyl, n-hexyl, 2-ethylhexyl, n-octyl, n-nonyl and the like; R is a valence bond or a divalent hydrocarbon radical generally containing one to twenty carbon atoms, inclusive, and preferably, containing four to six carbon atoms, inclusive, as for example, alkylene radicals, such as trimethylene, tetramethylene, pentamethylene, hexamethylene, 2-ethylhexamethylene, octamethylene, nonamethylene, and the like; cycloaliphatic radicals, such as 1,4-cyclohexane, 1,3-cyclohexane, 1,2-cyclohexane, and the like.

Particularly desirable epoxides, falling within the scope of Formula I, are those wherein $R_4$ through $R_{21}$ are hydrogen and R is alkylene containing four to six carbon atoms.

Among specific diepoxides of cycloaliphatic esters of dicarboxylic acids are the following:
bis(3,4-epoxycyclohexylmethyl)oxalate,
bis(3,4-epoxycyclohexylmethyl)adipate,
bis(3,4-epoxy-6-methylcyclohexylmethyl)adipate,
bis(3,4-epoxycyclohexylmethyl)pimelate, and the like.

Other suitable compounds are described in, for example, U.S. Pat. No. 2,750,395.

FORMULA II

A 3,4-epoxycyclohexylmethyl-3,4-epoxycyclohexane carboxylate having the formula:

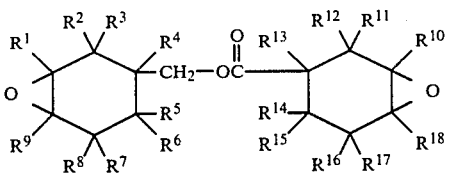

wherein $R^1$ through $R^{18}$ which can be the same or different are as defined for $R_4$ to $R_{21}$ in Formula I. Particularly desirable compounds are those wherein $R^1$ through $R^{18}$ are hydrogen.

Among specific compounds falling within the scope of Formula II are the following: 3,4-epoxycyclohexylmethyl-3,4-epoxycyclohexane carboxylate; 3,4-epoxy-1-methylcyclohexylmethyl-3,4-epoxy-1-methylcyclohexane carboxylate; 6-methyl-3,4-epoxycyclohexylmethyl-6-methyl-3,4-epoxycylohexane carboxylate; 3,4-epoxy-3-methylcyclohexylmethyl-3,4-epoxy-3-methylcyclohexane carboxylate; 3,4-epoxy-5-methylcyclohexylmethyl-3,4-epoxy-5-methylcyclohexane carboxylate. Other suitable compounds are described in, for example, U.S. Pat. No. 2,890,194.

FORMULA III

Diepoxides having the formula:

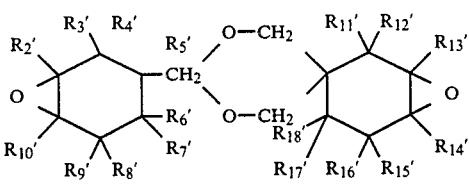

wherein the R's, which can be the same or different, are monovalent substituents such as hydrogen, halogen, i.e. chlorine, bromine, iodine or fluorine, or monovalent hydrocarbon radicals, or radicals as further defined in U.S. Pat. No. 3,318,822. Particularly, desirable compounds are those wherein all the R's are hydrogen.

Other suitable cycloaliphatic epoxides are the following:

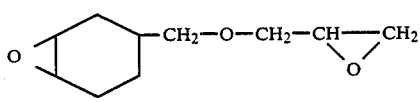

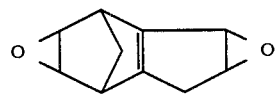

and the like.

The preferred cycloaliphatic epoxides are the following:

3,4-Epoxycyclohexylmethyl-3,4-Epoxycyclohexane carboxylate

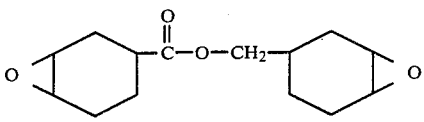

Bis(3,4-Epoxycyclohexylmethyl)adipate

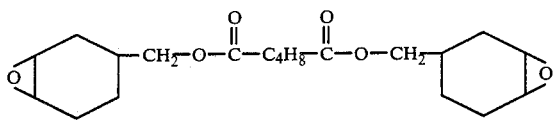

2-(3,4-Epoxycyclohexyl-5,5-spiro-3,4-epoxy)cyclohexane-meta-dioxane

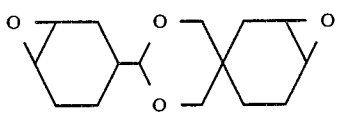

or mixtures thereof.

Epoxides with six membered ring structures may also be used, such as diglycidyl esters of phthalic acid, partially hydrogenated phthalic acid or fully hydrogenated phthalic acid. A representative diglycidyl ester of phthalic acid is the following:

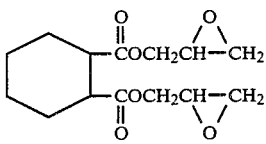

Diglycidyl esters of hexahydrophthalic acids being preferred.

The glycidyl-type epoxides are preferably diglycidyl ethers of bisphenol A which are derived from bisphenol A and epichlorohydrin and have the following formula:

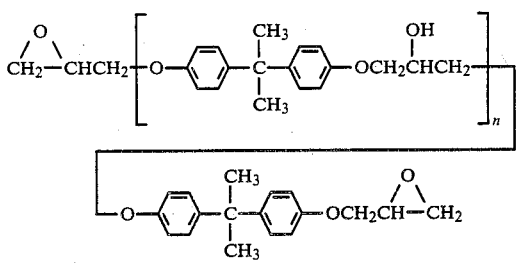

The cresol-novolac epoxy resins are multifunctional, solid polymers characterized by low ionic and hydrolyzable chlorine impurities, high chemical resistance, and thermal performance.

The epoxy phenol novolac resins are generally of the following formula:

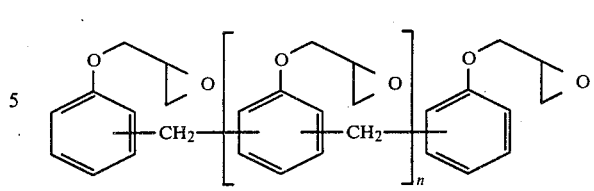

The polynuclear phenol-glycidyl ether-derived resins are generally of the formula:

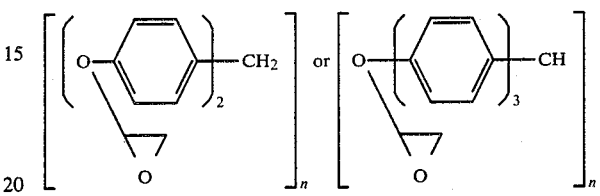

Among the aromatic and heterocyclic glycidyl amine resins which may be included herein are the following: tetraglycidylmethylenedianiline derived resins of the following formula:

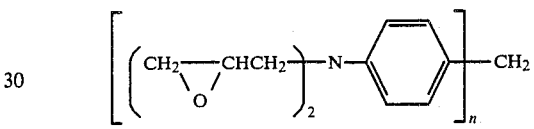

Triglycidyl-p-aminophenol derived resins, triazine based resins and hydantoin epoxy resins of the formula:

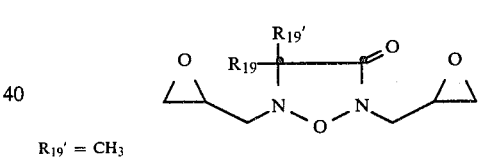

$R_{19}' = CH_3$

It is of course understood by those skilled in the art that when a photoinitiator is used only minor amounts of basic organic nitrogen containing epoxide compounds may be used so as not to interfere with the photocopolymerization reaction.

The cyclic vinyl ether containing compound is used in amounts of from 1 to about 99, preferably from about 5 to about 95, and the epoxide is used in amounts of from about 99 to 1, preferably from about 95 to about 5 parts.

The photoinitiators which may be used herein include one or more of a metal fluoroborate and a complex of boron trifluoride, as described in U.S. Pat. No. 3,379,653; a bis(perfluoroalkylsulfonyl)methane metal salt, as described in U.S. Pat. No. 3,586,616; an aryldiazonium compound, as described in U.S. Pat. No. 3,708,296; an aromatic onium salt of Group VIa elements, as described in U.S. Pat. No. 4,058,400; an aromatic onium salt of Group Va elements, as described in U.S. Pat. No. 4,069,055; a dicarbonyl chelate of a Group IIIa-Va element, as described in U.S. Pat. No. 4,086,091; a thiopyrylium salt, as described in U.S. Pat. No. 4,139,655; a Group VIa element an $MF_6^-$ anion where M is selected from P, As and Sb, as described in U.S. Pat. No. 4,161,478; a triarylsulfonium complex salt, as described in U.S. Pat. No. 4,231,951; and an aromatic iodonium complex salt and an aromatic sulfonium complex salt, as described in U.S. Pat. No. 4,256,828. Preferred photoinitiators include triarylsulfonium complex salts, aromatic sulfonium or iodonium salts of halogen-containing complex ions, and aromatic onium salts of Group IIIa, Va and VIa elements. Some of such salts are commercially available, such as FC-508 and FC-509 (available from Minnesota Mining and Manufacturing Company), and UVE-1014 (available from General Electric Company).

The photoinitiators are used in conventional amounts in the compositions of this invention such as in amounts from about 0.1 to 30 parts by weight per 100 parts by weight of the epoxides.

The compositions herein may include additives such as oils, particularly silicone oil, surfactants such as silicone-alkylene oxide copolymers and acrylic polymers, such as the Modaflows (obtained from Monsanto Chemical Co.), silicone oil containing aliphatic epoxide groups, fluorocarbon surfactants; low molecular weight alcohols; cellosolves, such as butyl cellosolve; carbitols, such as butyl carbitol and diethyleneglycol, and the like.

If desired, one may include in the compositions of this invention various conventional non-basic fillers (e.g., silica, talc, glass beads or bubbles, clays, powdered metal such as aluminum, silver, zinc oxide, etc.) and other additives such as viscosity modifiers, rubbers, tackifying agents, pigments, and the like.

The photocopolymerizable compositions are particularly suitable in a variety of applications in the fields of protective coatings and graphic arts due to their flexibility, impact resistance, abrasion-resistance, hardness and adhesion to rigid, resilient and flexible substrates such as metal, plastic, rubber, glass, paper, wood, and ceramics.

The composition may include a reactive diluent which is an unsubstituted or substituted cycloaliphatic monoepoxide. The unsubstituted cycloaliphatic monoepoxides include cyclohexene monoepoxide, and the like. The substituted cycloaliphatic monoepoxide is substituted with alkyl of 1 to 9 carbon atoms, halogen, oxygen, ether, hydroxyl, ester or vinyl radicals. Preferably, the substituted cycloaliphatic monoepoxide is vinyl substituted cycloaliphatic monoepoxide and is preferably selected from one or more of the following:

(1) 4-vinyl cyclohexane monoepoxide having the formula:

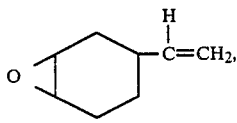

(2) norborene monoepoxide having the formula:

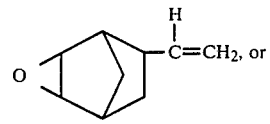

(3) limonene monoepoxide having the formula:

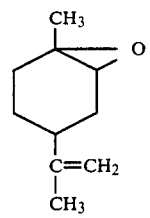

Another preferred substituted cycloaliphatic monoepoxide is hydroxyl substituted cycloaliphatic monoepoxide of the following formula:

The photopolymerization of the compositions of the invention occurs upon exposure of the compositions to any source of radiation emitting actinic radiation at a wavelength within the ultraviolet and visible spectral regions. Suitable sources of radiation include mercury, xenon, carbon arc lamps, sunlight, etc. Exposures may be from less than about 1 second to 10 minutes or more depending upon the amounts of particular polymerizable materials and photoinitiator being utilized and depending upon the radiation source and distance from the source and the thickness of the coating to be cured. The compositions may also be photopolymerized by exposure to electron beam irradiation. Generally speaking the dosage necessary is from less than 1 megarad to 100 megarads or more.

The compositions of this invention may be prepared simply by mixing the formulation ingredients together, preferably under "safe light" conditions when the photoinitiator is incorporated.

EXAMPLES

The following Examples serve to give specific illustration of the practice of this invention but they are not intended in any way to act to limit the scope of this invention.

The following designations used in the Examples have the following meaning:

Epoxy 1: 3,4-epoxycyclohexylmethyl-3,4-epoxycyclohexane carboxylate.

Epoxy 2: Bis(3,4-epoxycyclohexylmethyl)adipate.

Epoxy 3: 2-(3,4-epoxycylohexyl-5,5-spiro-3,4-epoxy)-cyclohexane-meta-dioxane.

Epoxy 4: A bisphenol A-based epoxy resin having the following formula:

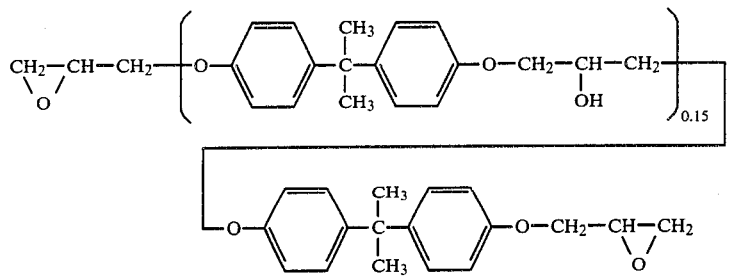

(Epon 828 obtained from Shell Chemical Co.)
Tetramer:

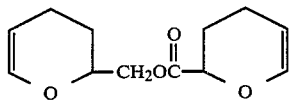

Dimer:

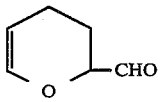

Monoepoxide: vinyl cyclohexene monoepoxide.
Surfactant 1: A silicone surfactant with the structure

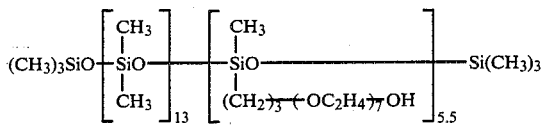

Surfactant 2: A fluorinated alkyl ester of the nonionic type (obtained from Minnesota Mining and Manufacturing Co., as FC-171)

Photoinitiator 1: UVE-1014, a solution of a triarylsulfonium hexafluoroantimony salt with a specific gravity of 1.39 and a Brookfield viscosity of 74 centipoise (obtained from General Electric Co.).

Photoinitiator 2: FC-508, a solution of a triarylsulfonium hexafluorophosphate with a specific gravity of 1.33 and a Brookfield viscosity of about 4,000 centipoise (at 25° C.) (obtained from Minnesota Mining and Manufacturing Company).

The procedures used to test coatings cured with the compositions of this invention were as follows:

Solvent Resistance (Double Acetone Rubs): a measure of the resistance of the cured film to attack by acetone in which a film coating surface was rubbed with an acetone soaked cheese cloth back and forth with hand pressure. A rub back and forth with hand pressure over the film coating surface with the acetone soaked cheesecloth was designated as one "double acetone rub". The effect that a certain number of double acetone rubs had on the film coating surface was reported by a number in parenthesis following the number of double acetone rubs. The rating system for evaluating acetone resistance for a given number of double acetone rubs was as follows:

NUMBER IN PARENTHESIS AFTER NUMBER OF RUBS (1) No change in coating appearance.
(2) Scratched surface.
(3) Dulled, marred, some coating removed.
(4) Breaks in coating appearance.
(5) About one-half of the coating removed.

Pencil Hardness—ASTMD-3363-74
The rating system for pencil hardness was as follows:

| 6B–5B–4B–3B–2B–B–HB–F–H–2H–3H–4H–5H–6H |
|---|
| Softer                              Harder |

Crosshatch adhesion—refers to a test using 10 parallel, single-edge, razor blades to scribe test films with 2 sets of perpendicular lines in a crosshatch pattern. Ratings are based on the amount of film removed after applying and subsequently pulling a contact adhesive tape (Scotch Brand 606) away from the surface of a scribed coating at a 90 degree angle in a fast, rapid movement. It is important to carefully apply and press the tape to the scribed coating to eliminate air bubbles and provide a good bond because adhesion is reported as the percent of film remaining on the substrate with a 100 percent rating indicating complete adhesion of the film to the substrate.

Reserve or face impact resistance—measures the ability of a given film to resist rupture from a falling weight. A Gardner Impact Tester using an eight-pound dart is used to test the film cast and cured on the steel panel. The dart is raised to a given height in inches and dropped onto the reverse or face side of a coated metal panel. The inches times pounds, designated inch-pounds, absorbed by the film without rupturing is recorded as the reverse or face impact resistance of the film.

Moisture Resistance—the cured film coating was immersed in water for a specified period of time and at a specified temperature. After removal from the water, the hydrolytic resistance of the cured film coating was determined by the pencil hardness test and the crosshatch adhesion test described hereinabove. Results obtained were compared with the results of identical tests performed on cured film coatings not immersed in water to determine moisture resistance.

CONTROLS A AND B AND EXAMPLE 1

This example describes the combination of Tetramer with Epoxy 1 and a photoinitiator. The mixture is activated with ultraviolet light.

The amounts of Tetramer, Epoxy 1 and photoinitiator shown in Table I were placed in amber bottles and mixed while working under a yellow light source.

The systems were coated onto Bonderite 37 steel plates with a No. 20 wire-wound rod and cured with one pass under a 100 watt per inch medium pressure energy vapor UV source at 30 feet per minute. The properties are shown in Table II.

DESCRIPTION OF THE CURED FORMULATIONS

Controls C and D and Examples 2 and 3—Tack free when warm immediately after UV exposure.

Examples 4 and 5—Slight tack when warm immediately after UV exposure but tack free when cooled to room temperature (about 25° C.).

TABLE IV

| Properties | Examples (No Post Cure, Room Temperature (about 25° C.) Aged 1 Day | | | | | |
|---|---|---|---|---|---|---|
|  | Control C | Control D | 2 | 3 | 4 | 5 |
| Acetone Double Rubs |  |  |  |  |  |  |
| 1–2 hrs | 100(1) | 100(1) | — | 36(4) | — | — |
| 1 day | 100(1) | 100(1) | 100(1) | 55(4) | 14(4) | 70(4) |
| Pencil Hardness | H | H | H | F | 3B | HB |
| Crosshatch Adhesion (%) | 100 | 100 | 100 | 100 | 100 | 100 |
| Gardner Impact (in lbs.) |  |  |  |  |  |  |
| Face | 15 | 10 | 15 | 320 | 320 | 25 |
| Reverse | <5 | <5 | <5 | 320 | 320 | <5 |

TABLE I

| Ingredients | Examples (parts by weight) | | |
|---|---|---|---|
|  | Control A | Control B | Example 1 |
| Tetramer | 23.9 | 24.4 | 11.9 |
| Epoxy 1 | — | — | 12.0 |
| Photoinitiator 1 | — | 0.5 | — |
| Photoinitiator 2 | 1.0 | — | 1.0 |
| Surfactant | 0.1 | 0.1 | 0.1 |

TABLE II

| Properties | Examples | | |
|---|---|---|---|
|  | Control A | Control B | Example 1 |
| Double Acetone Rubs |  |  |  |
| 1 hour | — | — | 36 |
| 2 hours | 100 | 100 | — |
| 24 hours | 100 | 100 | 55 |
| Pencil Hardness | H | H | F |
| Crosshatch Adhesion (%) | 100 | 100 | 100 |
| Gardner Impact (in. lbs.) |  |  |  |
| Face | 15 | 10 | 320 |
| Reverse | <5 | <5 | 320 |

CONTROLS C AND D AND EXAMPLES 2 TO 5

These examples describe the combination of Tetramer, Epoxy 1, Monoepoxide, photoinitiators and surfactants.

The ingredients listed in Table III were blended, coated and cured as described in Controls A and B and Example 1. The coating thickness was about 0.8 mil.

The properties are given in Table IV.

TABLE III

| Ingredients | Example (Parts by Weight) | | | | | |
|---|---|---|---|---|---|---|
|  | Control C | Control D | 2 | 3 | 4 | 5 |
| Tetramer | 95.6 | 97.6 | 71.6 | 47.6 | 23.6 | 48.0 |
| Epoxy 1 | — | — | 24.0 | 48.0 | 72.0 | 31.6 |
| Monoepoxide | — | — | — | — | — | 16.0 |
| Photoinitiator 1 | — | 2.0 | — | — | — | — |
| Photoinitiator 2 | 4.0 | — | 4.0 | 4.0 | 4.0 | 4.0 |
| Surfactant 1 | 0.4 | 0.4 | — | 0.4 | — | — |
| Surfactant 2 | — | — | 0.4 | — | 0.4 | 0.4 |

EXAMPLES 6 TO 9

These Examples describe the combination of Tetramer, combinations of epoxides, Monoepoxides initiator and surfactant.

The ingredients listed in Table V were blended, coated and cured as described in Controls A and B and Example 1.

The properties are listed in Table VI.

TABLE V

| Ingredients | Examples (Parts by Weight) | | | |
|---|---|---|---|---|
|  | 6 | 7 | 8 | 9 |
| Tetramer | 47.6 | 47.6 | 47.6 | 47.6 |
| Epoxy 1 | — | — | — | 16.0 |
| Monoepoxide | — | 16.0 | 8.0 | 8.0 |
| Epoxy 2 | 48.0 | 32.0 | — | 12.0 |
| Epoxy 3 | — | — | 40.0 | 12.0 |
| Photoinitiator 2 | 4.0 | 4.0 | 4.0 | 4.0 |
| Surfactant 2 | 0.4 | 0.4 | 0.4 | 0.4 |

DESCRIPTION OF THE FORMULATION

Examples 6 and 7—Slight tack when warm immediately after UV cure. Tack free when cooled to room temperature (about 25° C.).

Example 8—Tacky when warm immediately after UV cure. Slight tack when cooled to room temperature (about 25° C.).

Example 9—Slight tack when warm immediately after UV cure. Very slight tack when cooled to room temperature (about 25° C.).

TABLE VI

| Properties | Examples (Aged 18 Hrs at Room Temperature about 25° C.) | | | |
|---|---|---|---|---|
|  | 6 | 7 | 8 | 9 |
| Acetone Double Rubs | 100(1) | 80(4) | 10(4) | 100(1) |
| Pencil Hardness | H | H | 5B | H |
| Crosshatch Adhesion (%) | 100 | 100 | 100 | 98 |
| Gardner Impact (in lbs.) |  |  |  |  |
| Face | 25 | 25 | 320 | 25 |
| Reverse | <5 | <5 | 320 | <5 |

EXAMPLES 10 TO 14

These Examples describe the combination of Dimer, epoxide, photoinitiator and surfactant.

The ingredients listed in Table VII were blended, coated and cured as described in Controls A and B and Example 1. The viscosity of the blends were measured at 24.4° C. in a Brookfield viscometer and are listed in Table VII.

The properties are listed in Table VIII.

TABLE VII

| Ingredients | Examples (grams) | | | | |
|---|---|---|---|---|---|
| | 10 | 11 | 12 | 13 | 14 |
| Dimer | 9.8 | 2.0 | 4.0 | 6.0 | 8.0 |
| Epoxy I | 9.8 | 18.0 | 16.0 | 14.0 | 12.0 |
| Photoinitiator I | 0.4 | — | — | — | — |
| Photoinitiator II | — | 0.8 | 0.8 | 0.8 | 0.8 |
| Surfactant 1 | 0.08 | 0.08 | 0.08 | 0.08 | 0.08 |
| Viscosity (centipoise) | 20 | 210 | 90 | 50 | 30 |

The Examples show that the Dimer is an excellent, low-viscosity reactive diluent for cationic-curable systems.

All coatings were tack free when warm immediately after UV exposure.

TABLE VIII

| Properties | Examples (grams) | | | | |
|---|---|---|---|---|---|
| | 10 | 11 | 12 | 13 | 14 |
| Double Acetone Rubs | 100(1) | 100(1) | 100(1) | 100(1) | 100(1) |
| Pencil Hardness | 2H | F | 3H | 3H | 3H |
| Crosshatch Adhesion (%) | 25 | 100 | 100 | 100 | 100 |
| Gardner Impact (in. lbs.) | | | | | |
| Face | 15 | 15 | 15 | 15 | 15 |
| Reverse | <5 | <5 | <5 | <5 | <5 |
| Water Resistance Test | | | | | |
| 3-Hour Room Temp. | | | | | |

TABLE VIII-continued

| Properties | Examples (grams) | | | | |
|---|---|---|---|---|---|
| | 10 | 11 | 12 | 13 | 14 |
| (about 25° C.) Water Immersion | | | | | |
| Pencil Hardness | H | HB | F | H | H |
| Crosshatch Adhesion (%) | 0 | 100 | 100 | 100 | 95 |
| 3-Day Room Temp. Water Immersion | | | | | |
| Pencil Hardness | — | 2B | 2B | 4B | 4B |
| Crosshatch Adhesion (%) | — | 100 | 40 | <5 | <5 |

CONTROLS E TO G AND EXAMPLES 15 TO 20

These examples describe the use of Dimer as a cyclic vinyl ether that markedly reduces the viscosity of cycloaliphatic epoxides. Also, the Dimer cures well with such compounds in the presence of ultraviolet light when photoinitiators are employed to yield coatings.

The ingredients listed in Table IX were blended, coated and cured as described in Controls A and B and Example 1. The viscosity of the blends were measured at 25° C. in a Brookfield viscometer and are listed in Table IX.

The properties are listed in Table X.

TABLE IX

| Ingredients | Examples (grams) | | | | | | | | |
|---|---|---|---|---|---|---|---|---|---|
| | Control E | 15 | 16 | Control F | 17 | 18 | Control G | 19 | 20 |
| Dimer | — | 1.0 | 2.0 | — | 2.0 | 4.0 | — | 4.0 | 6.0 |
| Epoxy 1 | 20.0 | 19.0 | 18.0 | — | — | — | — | — | — |
| Epoxy 2 | — | — | — | 20.0 | 18.0 | 16.0 | — | — | — |
| Epoxy 3 | — | — | — | — | — | — | 20.0 | 16.0 | 14.0 |
| Photoinitiator 1 | 0.8 | 0.8 | 0.8 | 0.8 | 0.8 | 0.8 | 0.8 | 0.8 | 0.8 |
| Surfactant 1 | 0.08 | 0.08 | 0.08 | 0.08 | 0.08 | 0.08 | 0.08 | 0.08 | 0.08 |
| Viscosity (centipoise | 450 | 350 | 310 | 660 | 460 | 250 | 84,000 | 1800 | 600 |

TABLE X

| Properties | EXAMPLES | | | | | | | | |
|---|---|---|---|---|---|---|---|---|---|
| | Control E | 15 | 16 | Control F | 17 | 18 | Control G | 19 | 20 |
| | (Determined 4 days after UV exposure) | | | | | | | | |
| Double Acetone Rubs | 40(5) | 100(1) | 100(1) | 100(1) | 100(1) | 100(1) | 5(5) | 40(4) | 100(1) |
| Pencil Hardness | H | 3H | 3H | H | 3H | 3H | Tacky | F | H |
| Crosshatch Adhesion (%) | 100 | 100 | 100 | 100 | 100 | 100 | — | 97 | 97 |
| Impact (in. lbs.) | | | | | | | | | |
| Face | 15 | 15 | 15 | 25 | 25 | 25 | — | <5 | <5 |
| Reverse | <5 | <5 | <5 | <5 | <5 | <5 | — | <5 | <5 |
| Water Resistance | | | | | | | | | |
| Water Immersion (25° C.) | | | | | | | | | |
| Hardness, 3 hrs. | B | F | H | B | H | F | — | 2B | H |
| Adhesion, (%) 3 hrs. | 100 | 100 | 99 | 100 | 0 | 0 | — | 98 | 98 |
| Hardness, 48 hrs. | 2B | F | F | B | — | — | — | 2B | F |
| Adhesion (%), 48 hrs. | 100 | 100 | 100 | 100 | — | — | — | 50 | 35 |

Thus, acrolein dimer imparts improved properties such as solvent resistance, hardness, water resistance, and viscosity reduction. Not all properties are enhanced for each epoxide. For example, the viscosity reduction is markedly apparent for Control E which has a viscosity of 84,000 centipoise. When 20% acrolein dimer (Example 19) is added, the viscosity is reduced to 1,800 centipoise.

EXAMPLES 21 TO 24

This example describes the combination of Dimer, Epoxy 1, Epoxy 4, photoinitiator, and surfactant.

The ingredients listed in Table XI were blended, coated, and cured as described in Controls A and B in Example 1. Although the viscosity was not measured, it was apparent that Dimer markedly reduced the viscosity of the formulations. The Acetone resistance given in the Table indicates that the systems under went polymerization to yield crosslinked coatings.

TABLE XI

| Ingredients | Example (Parts by Weight) | | | |
|---|---|---|---|---|
| | 21 | 22 | 23 | 24 |
| Epoxy 4 | 8.0 | 6.0 | 4.0 | 2.0 |
| Dimer | 2.0 | 4.0 | 2.0 | 4.0 |
| Photoinitiator 1 | 0.4 | 0.4 | 0.4 | 0.4 |
| Surfactant 1 | 0.05 | 0.05 | 0.05 | 0.05 |
| Epoxy 1 | — | — | 4.0 | 4.0 |
| Properties | | | | |
| Acetone Resistance after 45 minutes | 52(4) | 100(2) | 100(1) | 100(1) |

What is claimed is:

1. A composition suitable for photocopolymerization comprising:
   (a) from about 5 to 95 parts by weight of a cyclic vinyl ether compound, said cyclic vinyl ether compound being a member selected from the group consisting of dihydropyranyl compounds, di-(dihydropyranyl) compounds, and mixtures of these;
   (b) from about 95 to 5 parts by weight of cycloaliphatic epoxide resins, said cycloaliphatic epoxide resins being a mixture of
      (i) 3,4-epoxy-cyclohexylmethyl-3,4-epoxycyclohexane carboxylate,
      (ii) bis(3,4-epoxycyclohexylmethyl)adipate, and
      (iii) 2-(3,4-epoxycyclohexyl)-5,5-spiro-3,4-epoxy)cyclohexane-meta-dioxane;
   (c) a vinyl cycloaliphatic monoepoxide, said vinyl cycloaliphatic monoepoxide being a member selected from the group consisting of the formulas:

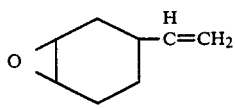

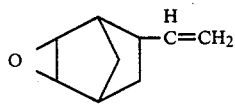

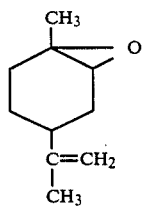

and mixtures of these; and
   (d) an amount of a photoinitiator effective to cure said composition.

2. A composition as defined in claim 1 wherein the cyclic vinyl ether compound is selected from the following:

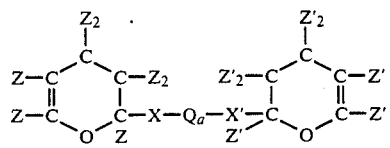

the Z's each represents hydrogen or an alkyl group having from 1 to 10 carbon atoms;

X and X' are members of the class consisting of a bivalent saturated hydrocarbon group, R, having the structure, —$C_nH_{2n}$—, wherein n is an integer having a value of from 1 to 10; an oxy radical, —O—; and a carbonyl group, —C(O)—; and, in addition X' may be a carbonyloxy group, —O(O)C—, the carbon atom of which is bonded to the 2-position of the dihydropyranyl ring; X and X' may be the same or different provided that taken together they contain either zero or 2 oxygen atoms;

a has a value of from zero to 1, a being zero only when X' is the aforesaid carbonyloxy group;

Q is a member of the class consisting of the aforesaid R group; a dioxylakylene group, —ORO—, wherein R is as defined above; a dicarboxylate group, —OC—(O)—R'—C(O)O,— wherein R' is the nucleus of a dicarboxylic acid; and a polycarbamate group such as the dicarbamate group, —OC(O)NH—R"—NH—C(O)O—, wherein R", as illustrated is the nucleus of a diisocyanate; and X, X' and Q taken together is such that the linking chain, —X—Q—X'—, contains an even number of oxygen atoms from two to four, provided that when X and X' are both oxy radicals, the linking chain contains no other oxygen atoms (that is, Q or R), and when X and X' are both carbonyl groups, the linking chain contains four oxygen atoms (that is, Q is —ORO—).

3. A composition as defined in claim 1 wherein the cyclic vinyl ether compound is 3,4-dihydro-2H-pyran-2-methyl(3,4-dihydro-2H-pyran-2-carboxylates) having the formula:

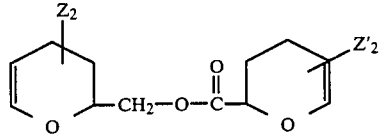

wherein Z and Z' are as above-defined.

4. A composition as defined in claim 1 wherein the cyclic vinyl ether compound is alkanedioxy-bis(3',4'-dihydro-2'H-pyran-2'-carbonyl) compounds having the structure:

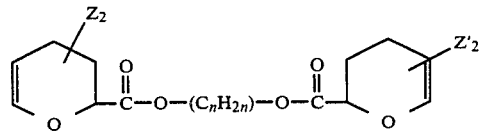

wherein Z and Z' are as defined in claim 2, and n is an integer from 1 to 10

5. A composition as defined in claim 1 wherein the cyclic vinyl ether compound is bis-(3',4'-dihydro-2'H-pyran-2'-oxy)alkanes having the formula:

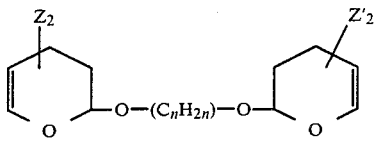

wherein Z, Z' are as defined in claim 2 and n is as defined in claim 4.

6. A composition as defined in claim 1 wherein the cyclic vinyl ether compound is bis-(3',4'-dihydro-2'H-pyran-2'-alkoxy)alkanes having the formula:

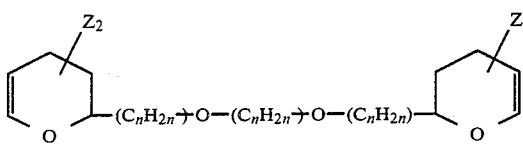

wherein Z, Z' are as defined in claim 2 and n is as defined in claim 4.

7. A composition as defined in claim 1 wherein the cyclic vinyl ether compound is bis-(3',4'-dihydro-2'H-pyran-2'-alkyl)carboxylates having the general formula:

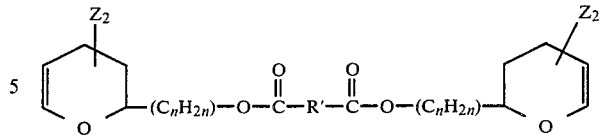

wherein Z, Z' are as defined in claim 2, n is as defined in claim 4 and R' is the nucleus of a dicarboxylic acid and may be a bivalent aliphatic, cycloaliphatic or aromatic nucleus including corresponding halogen-substituted nuclei.

8. A composition as defined in claim 1 wherein the cyclic vinyl ether compound has the general formula:

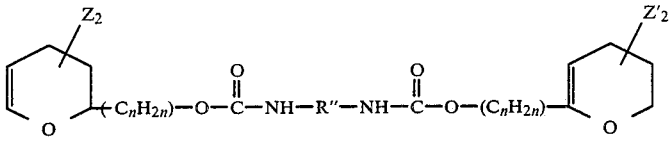

wherein Z, Z' are as defined in claim 2, n is as defined in claim 4, R'' is an aliphatic, cycloaliphatic or aromatic radical which may be unsubstituted hydrocarbyl groups or hydrocarbyl groups substituted with halogen or alkoxy groups.

9. A composition as defined in claim 1 wherein said vinyl cycloaliphatic monoepoxide is vinyl cyclohexene monoepoxide.

10. A composition as claimed in claim 1 wherein the photoinitiator is selected from diazonium salts or onium salts, or mixtures thereof.

11. A radiation cured coating derived from the composition of claim 1.

* * * * *